United States Patent
Kindt et al.

(10) Patent No.: US 7,049,035 B2
(45) Date of Patent: May 23, 2006

(54) METHOD FOR CONTROLLING LINEWIDTH IN ADVANCED LITHOGRAPHY MASKS USING ELECTROCHEMISTRY

(75) Inventors: Louis M. Kindt, Milton, VT (US); Carey W. Thiel, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 10/707,034

(22) Filed: Nov. 17, 2003

(65) Prior Publication Data

US 2005/0106474 A1 May 19, 2005

(51) Int. Cl.
*G01F 9/00* (2006.01)

(52) U.S. Cl. .......................................... 430/5
(58) Field of Classification Search .............. 430/5; 438/638, 672
See application file for complete search history.

(56) References Cited

U.S. PATENT DOCUMENTS

| | | | |
|---|---|---|---|
| 5,707,765 A | 1/1998 | Chen | |
| 5,780,187 A | 7/1998 | Pierrat et al. | |
| 5,935,733 A | 8/1999 | Scott et al. | |
| 5,935,737 A | 8/1999 | Yan | |
| 6,139,993 A | 10/2000 | Lee et al. | |
| 6,235,434 B1 | 5/2001 | Sweeney et al. | |
| 6,309,976 B1 | 10/2001 | Lin et al. | |
| 6,368,762 B1 | 4/2002 | Ling | |
| 6,368,974 B1 | 4/2002 | Tsai et al. | |
| 6,627,362 B1 | 9/2003 | Stivers et al. | |
| 6,787,460 B1 * | 9/2004 | Lee et al. | 438/672 |
| 6,797,620 B1 * | 9/2004 | Lewis et al. | 438/687 |
| 2002/0115000 A1 | 8/2002 | Gupta et al. | |
| 2004/0091789 A1 * | 5/2004 | Han et al. | 430/5 |

* cited by examiner

*Primary Examiner*—S. Rosasco
(74) *Attorney, Agent, or Firm*—Richard Kotulak; Cantor Colburn LLP

(57) ABSTRACT

A method for controlling the linewidth of a feature formed within an advanced lithography mask includes electrochemically depositing an additive material on exposed sidewalls of an etched first layer of the mask, wherein the top of the etched first layer remains covered by a hardmask used during the etching of the first layer. A second layer beneath the etched first layer is resistant to the electrochemical deposition of the additive material thereupon.

19 Claims, 2 Drawing Sheets

METHOD FOR CONTROLLING LINEWIDTH IN ADVANCED LITHOGRAPHY MASKS USING ELECTROCHEMISTRY

BACKGROUND OF INVENTION

The present invention relates generally to semiconductor device processing and, more particularly, to a method for controlling linewidth in the manufacture of advanced lithography masks using electrochemistry.

Lithography is a well known technique for applying patterns to the surface of a workpiece, such as a circuit pattern to a semiconductor chip or wafer. This technique has the additional advantage of being able to faithfully reproduce small and intricate patterns. Traditional optical phololithography involves applying electromagnetic radiation to a mask having openings formed therein (i.e., a transmission mask) such that the light or radiation that passes through the openings is applied to a region on the surface of the workpiece that is coated with a radiation-sensitive substance (e.g., a photoresist). The other type of potential next generation lithography (NGL) mask is an extreme ultraviolet lithography (EUVL) mask. The EUVL mask works by reflecting and absorbing the incident radiation. For both types of masks, the mask pattern is reproduced on the surface of the workpiece by removing the exposed or unexposed photoresist. The capabilities of conventional lithographic techniques have been severely challenged by the need for circuitry of increasing density and higher resolution features. The demand for smaller feature sizes has driven the wavelength of radiation needed to produce the desired pattern to ever shorter wavelengths. Moreover, the International Technology Roadmap for Semiconductors (ITRS) projects (for both optical and next generation lithography (NGL) masks) a steady decrease in both the mean critical dimension (CD) and mean-to-target allowance on the mask. Currently on 90 nanometer (nm) masks, the CD mean-to-target is 7.2 nm for alternating masks and 9 nm for attenuating masks, while for the 45 nm node it decreases to 3.5 nm. Although write systems and etch technologies are expected to improve for the 45 nm node and beyond in order to make attaining this target more feasible, it is nonetheless a very difficult target to meet. Currently, feedforward and feedback control systems are being used in wafer processing to correct for CD variations. However, in mask production, mask quantities are much smaller and thus the feedback approach is not feasible. Typically, if a mask does not meet the CD mean-to-target, the mask is scrapped and a new mask is put into production. Not only is this expensive due to the cost of the raw materials and processing time, but turn around time is also significantly impacted.

As the technology nodes get smaller and smaller, these effects become even more important as the materials and processing costs become even higher and the degree of difficulty in manufacturing the masks increases dramatically. Accordingly, it would be desirable to be able to alleviate this problem by enabling the salvaging of the masks that would otherwise have been scrapped for linewidths that are larger than the mean-to-target.

SUMMARY OF INVENTION

The foregoing discussed drawbacks and deficiencies of the prior art are overcome or alleviated by a method for controlling the linewidth of a feature formed within a lithography mask. In an exemplary embodiment, the method includes electrochemically depositing an additive material on exposed sidewalls of an etched first layer of the mask, wherein the top of the etched first layer remains covered by a hardmask used during the etching of the first layer. A second layer beneath the etched first layer is resistant to the electrochemical deposition of the additive material thereupon.

In another aspect, a method for controlling the linewidth in an extreme ultraviolet lithography (EUVL) mask includes electrochemically depositing an additive material on exposed sidewalls of an etched absorber layer of the mask, wherein the top of the etched absorber layer remains covered by a hardmask used during the etching of the absorber layer. A buffer layer beneath said etched absorber layer is resistant to the electrochemical deposition of the additive material thereupon.

In still another aspect, an extreme ultraviolet lithography (EUVL) mask structure includes a multilayer (ML) reflective layer formed on a starting substrate, a buffer layer formed on the reflective layer, and an absorber layer formed on the buffer layer, wherein the absorber layer includes an electrochemically deposited additive material on exposed sidewalls during initial etching thereof.

BRIEF DESCRIPTION OF DRAWINGS

Referring to the exemplary drawings wherein like elements are numbered alike in the several Figures.

DETAILED DESCRIPTION

The trend toward shorter wavelengths has also required the development of a different type of mask because of the fact that extreme ultraviolet (EUV) radiation, i.e., radiation in the spectral region between 10 and 15 nm, is generally strongly absorbed by condensed matter. Thus, efficient lithography using EUV radiation requires the use of reflective optics. Consequently, a mask useful for lithography employing EUV has a unique architecture, characterized by a reflective multilayer coating deposited onto a highly polished defect-free substrate. A patterned absorber layer is disposed on the surface of the reflective multilayer coating. The multilayer (used to make the substrate reflective at EUV wavelengths) is composed of alternating layers of EUV-reflective material. A typical multilayer coating, or stack, may be a 40-layer pair of metallic molybdenum (Mo) and silicon (Si) with a periodicity of about 7 nm. The mask substrate having a multilayer stack disposed thereon is commonly referred to as the mask blank.

The present disclosure is directed toward salvaging those masks (such as EUVL masks) that fail to meet the CD target. More specifically, the salvaging process is focused on masks that have CDs greater than the targeted critical dimension by decreasing the linewidth of all features on the mask through the use of electrochemical and/or electroless deposition. In addition, area-specific deposition could be implemented on a macroscopic scale, wherein specific macroscopic regions could be electroplated without affecting the remainder of the mask. The electrochemical deposition selectively plates onto the sidewalls of the absorber material to decrease the linewidths of the mask features, and would not plate on any of the other mask films due to the selectivity of the deposition. The mask film stack is chosen to optimize the electrochemical plating process while still maintaining the necessary optical properties of the mask at the required exposure wavelength.

Accordingly, disclosed herein is a method for controlling linewidth in the manufacture of advanced lithography masks through the utilization of electrochemistry (e.g., electrochemical deposition and/or electroless plating) (the abbreviation ECD refers to both the deposition and plating method) as an additive build process. An electrochemical reaction involves the transfer of electrons through a chemical reaction from one species to another. In the electrochemical deposition, electrons are supplied from an external source, such as an electrical power supply, whereas in electroless deposition, the exchange of electrons comes from the actual chemical reactants. Through either of these processes it is possible to selectively grow a thin film on the sidewalls of the absorber without depositing the films on the buffer and hardmask layers.

Figure 1:
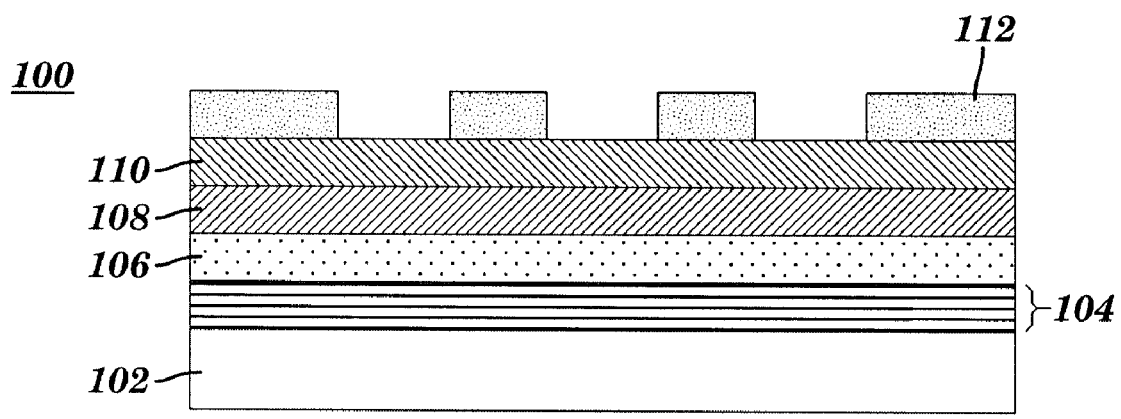
FIGS. 1 through 3 illustrate an exemplary formation process of an extreme ultraviolet radiation lithography (EUVL) mask, in which the resulting critical dimension of particular features of the mask exceed the desired target value.

Referring initially to FIG. 1, there is shown a cross-sectional view of the fabrication of an exemplary reflective, extreme ultraviolet lithography (EUVL) mask 100. As is shown, the EUVL mask 100 includes a starting substrate 102, which may include any substrate that can handle subsequent fabrication processes and is typically made of a material having a low thermal expansion, such as, for example, ULE®, an ultra-low expansion titanium silicate glass made by Corning Corporation of New York. Formed upon the substrate 102 is a multilayer (ML) reflector layer 104 that generally includes multiple layers of material with alternating index of refraction for providing a resonant reflectivity when the period of the layers is approximately one half the wavelength of the radiation used in the imaging system.

A number of different combinations of reflective and transmissive materials may be used for the ML reflector layer 104. In one implementation, the materials used in the reflector layer 104 are molybdenum (Mo) and silicon (Si), which are alternately layered at thicknesses of about 2 to 12 nm, to create a ML reflector thickness of about 50 to 500 nm, for example. Collectively, the formation of the ML reflector layer 104 upon the starting substrate 102 is also known in the art as a mask blank.

Next, a buffer layer 106 is formed upon the ML reflector layer 104 using any suitable technique such as physical vapor deposition or sputtering. The technique is performed at a temperature selected to avoid modification to the underlying ML reflector 104. The buffer layer 106 may be made of any material (such as tantalum nitride (TaN), silicon dioxide ($SiO_2$), carbon (C) or ruthenium (Ru), for example) that serves as a stop layer or an etch profile controller, so long as the buffer layer 106 protects the underlying ML reflector 104 during subsequent mask etching and repair while also ensuring that etched patterns in the absorber layer are clean and substantially vertical. Furthermore, the buffer layer 106 should be easy to selectively remove or etch. The thickness of the buffer layer 106 is mostly determined by absorber etch selectivity to the buffer material, repair etch selectivity to the ML reflector, and optical inspection contrast. In one implementation, the buffer layer 106 has a thickness ranging from about 30 to about 50 nm.

An absorber layer 108 is then formed on the buffer layer 106, wherein the material used for the absorber layer 108 is absorptive of radiation at the wavelength used in the imaging system, and can be selectively etched. The absorber layer 108 may be made of any material or composition that meets these criteria, such as, for example, nickel (Ni), a cobalt nickel alloy (CoNi), tantalum (Ta), tantalum nitride (TaN), and tantalum boron nitride (TaBN). The thickness of the absorber layer 108 is also mostly determined by the radiation absorption of the material used for this layer.

Figure 2:
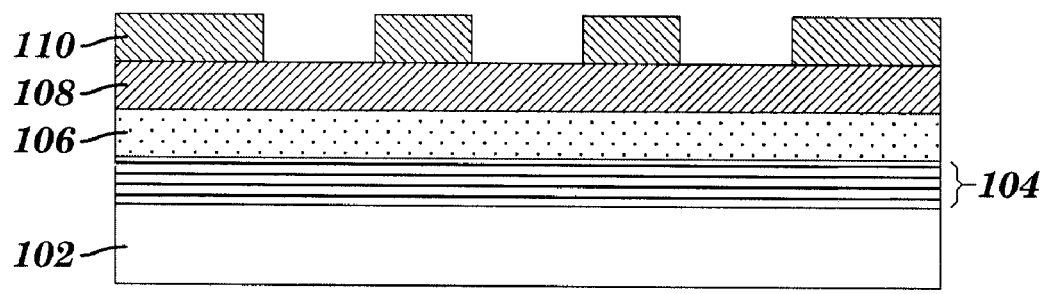
Figure 3:
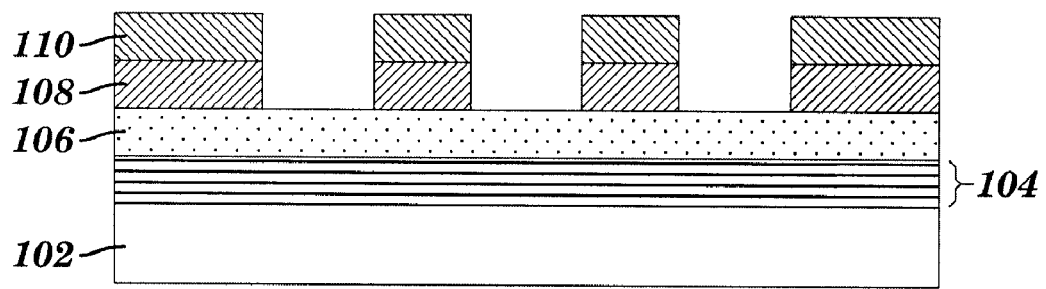

A dielectric hardmask layer (e.g., an oxide of silicon) 110 is then formed over the absorber layer 108 to be used for subsequent patterning of the absorber layer 108. As further shown in FIG. 1, a resist layer 112 is patterned with the desired features to be subsequently transferred to the absorber and buffer layers. FIG. 2 illustrates the transfer of the resist pattern into the hardmask layer 110 by, for example, an etch process using a fluorine based chemistry. Then, another etch is used to transfer the pattern from the hardmask layer 110 to the absorber layer 108, as shown in FIG. 3. This process may be, for example, a Ni etch using an $Ar/O_2/Cl_2$ chemistry (sputter etch) or a $CO/NH_3$ chemistry (chemical etch).

Figure 4:
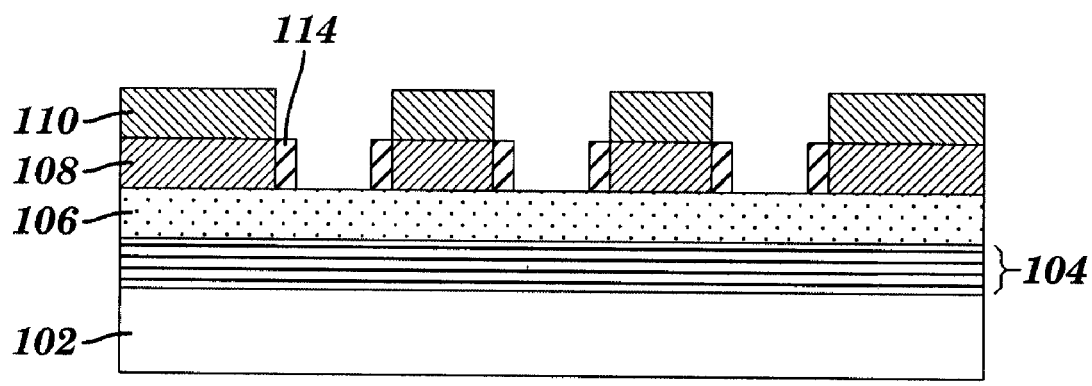
FIGS. 4 and 5 illustrate a method for controlling linewidth in advanced lithography masks using electrochemistry, in accordance with an embodiment of the invention.

As stated previously, an inspection following the absorber layer etch might reveal that the critical dimension of the mask features is greater that the target value. However, rather than simply scrapping the EUVL mask and starting over, a corrective process may be implemented to provide added material on the sidewalls of the absorber layer 108, such that the desired critical dimension is attained. To this end, FIG. 4 illustrates a method for controlling the linewidth of a feature formed within a photolithography mask, in accordance with an embodiment of the invention. As is shown, an ECD process is used to deposit a thin film 114 of additive material on the sidewalls of the absorber layer 108. The thin film 114 may be formed by either electroless deposition or electroplating, wherein (in either case), the absorber material acts as the oxidant. By leaving the etched hardmask layer 110 in place during the ECD process, no material is grown on the top of the absorber layer 108. This is desired since any height added to the EUVL absorber layer 108 will lead to poor printing results due to a shadowing effect. Moreover, no film is deposited on either the buffer layer 106 or the hardmask layer 110 since neither material would be capable of accepting the electrons.

The deposited thin film material 114 from an electroplating bath may be nickel, for example. Due to the properties of the chemical reaction, the Ni will not deposit onto a TaN buffer layer or a $SiO_2$ hardmask. In addition to nickel, other commercially available ECD baths include, but are not limited to: platinum (Pt), ruthenium (Ru), palladium (Pd), cobalt (Co), and cobalt tungsten (CoW). However, each of these baths would be used in conjunction with an absorber film different than Ni. Regardless of the plating material used, it will be appreciated that the process is controlled in a manner so as not to overgrow the amount of sidewall film material 114.

Figure 5:
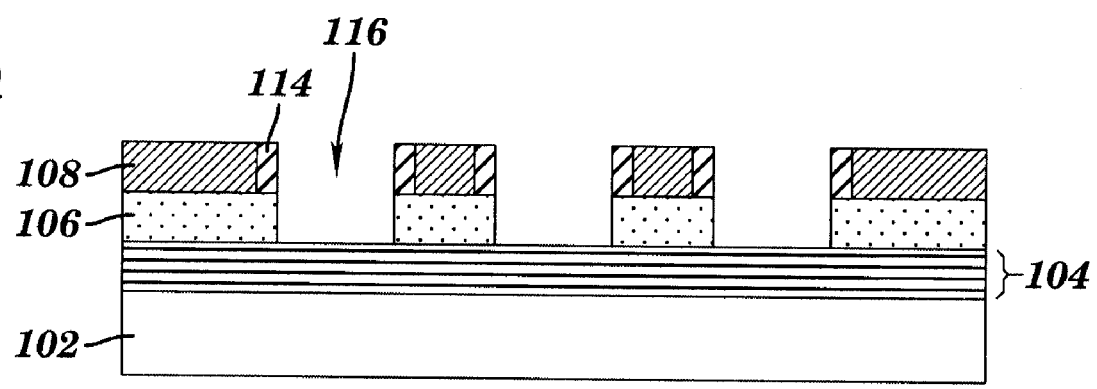

Finally, as shown in FIG. 5, the hardmask layer 110 is removed and the absorber layer 108 (with the newly added sidewall film material 114) is used to pattern the corrected features that are subsequently etched into the buffer layer 106. Thus, for example, the etched opening 116 in between adjacent portions of the buffer layer 106 is narrower than would be the case had the etching been carried out using the dimensions of the original pattern etched into the absorber layer 108 (FIG. 3).

Although the exemplary embodiments discussed herein are particularly suited for processing of EUVL masks, the electrochemical additive process could also be applied to the repair of linewidth/CD defects found in optical lithography photomasks, so long as the material used for the opaque layer in the mask structure is compatible with a suitable electroless or electrochemical bath that will deposit material thereupon. Again, examples of suitable opaque layers include, but are not limited to Ni, Ni alloys, Co alloys, Pd, Pt, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for controlling the linewidth of a feature formed within a lithography mask, the method comprising:

electrochemically depositing an additive material on exposed sidewalls of an etched first layer of the mask, wherein the top of said etched first layer remains covered by a hardmask used during the etching of said first layer, and wherein a second layer beneath said etched first layer is resistant to the electrochemical deposition of said additive material thereupon;

removing said hardmask; and etching said second layer with a resulting pattern defined by said etched first layer plus said additive material.

2. The method of claim 1, wherein said electrochemically depositing said additive material further comprises an electroless deposition process.

3. The method of claim 1, wherein said electrochemically depositing said additive material further comprises an electroplating process.

4. The method of claim 1, wherein:

said first layer comprises an optically opaque layer; and said second layer comprises a buffer layer between said first layer and a reflective layer underneath said second layer.

5. The method of claim 1, wherein:

said first layer comprises one of a nickel and a cobalt nickel alloy layer;

said second layer comprises a tantalum nitride layer; and said hardmask further comprises a dielectric layer.

6. A method for controlling the linewidth in an extreme ultraviolet lithography (EUVL) mask, the method comprising:

electrochemically depositing an additive material on exposed sidewalls of an etched absorber layer of the mask, wherein the top of said etched absorber layer remains covered by a hardmask used during the etching of said etched absorber layer, and wherein a buffer layer beneath said etched absorber layer is resistant to the electrochemical deposition of said additive material thereupon;

removing said hardmask; and etching said buffer layer with a resulting pattern defined by said absorber first layer plus said additive material.

7. The method of claim 6, wherein said electrochemically depositing said additive material further comprises an electroless deposition process.

8. The method of claim 6, wherein said electrochemically depositing said additive material further comprises an electroplating process.

9. The method of claim 6, wherein:

said absorber layer comprises an optically opaque layer; and said buffer layer is disposed between said absorber layer and multilayer (ML) reflective layer underneath said buffer layer.

10. The method of claim 6, wherein:

said absorber layer comprises one of a nickel and a cobalt nickel alloy layer;

said buffer layer comprises a tantalum nitride layer; and said hardmask further comprises a dielectric layer.

11. The method of claim 10, wherein said ML reflective layer further comprises alternating layers of molybdenum (Mo) and silicon (Si).

12. The method of claim 6, wherein said electrochemically depositing an additive material is implemented with an electroplating bath comprising at least one of platinum (Pt), ruthenium (Ru), palladium (Pd), cobalt (Co), and cobalt tungsten (CoW).

13. An extreme ultraviolet lithography (EUVL) mask structure, comprising:

a multilayer (ML) reflective layer formed on a starting substrate;

a buffer layer formed on said reflective layer;

an absorber layer formed on said buffer layer, wherein said absorber layer includes an electrochemically deposited additive material on exposed sidewalls during initial etching thereof.

14. The EUVL mask structure of claim 13, The method of claim 8, wherein said electrochemically deposited additive material further comprises an electrolessly deposited material.

15. The EUVL mask structure of claim 13, wherein said electrochemically deposited additive material further comprises an electroplated material.

16. The EUVL mask structure of claim 13, wherein said absorber layer comprises an optically opaque layer.

17. The EUVL mask structure of claim 13, wherein:

said absorber layer comprises one of a nickel and a cobalt nickel alloy layer; and said buffer layer comprises a tantalum nitride layer.

18. The EUVL mask structure of claim 17, wherein said ML reflective layer further comprises alternating layers of molybdenum (Mo) and silicon (Si).

19. The EUVL mask structure of claim 13, wherein said electrochemically deposited additive material is implemented with an electroplating bath comprising at least one of platinum (Pt), ruthenium (Ru), palladium (Pd), cobalt (Co), and cobalt tungsten (CoW).

* * * * *